United States Patent [19]

Moresco et al.

[11] Patent Number: 5,404,265
[45] Date of Patent: Apr. 4, 1995

[54] INTERCONNECT CAPACITORS

[75] Inventors: Larry L. Moresco, San Carlos; David G. Love, Pleasanton; Wen-Chou V. Wang, Cupertino, all of Calif.

[73] Assignee: Fujitsu Limited, Japan

[21] Appl. No.: 937,363

[22] Filed: Aug. 28, 1992

[51] Int. Cl.$^6$ .............................................. H01G 1/14
[52] U.S. Cl. ................................ 361/306.1; 361/303; 361/766; 29/25.42
[58] Field of Search ................... 357/70, 71, 74, 80, 357/75; 361/306, 386, 388, 400, 401, 405, 403, 303, 306.1, 306.2, 734, 738, 763, 766; 174/52 FP; 29/25.42; 257/665, 781, 773, 759, 760, 772, 777, 778, 779, 781

[56] References Cited

U.S. PATENT DOCUMENTS

| | | | |
|---|---|---|---|
| 3,191,098 | 6/1965 | Fuller | 361/763 |
| 3,962,713 | 6/1979 | Kandall et al. | 357/14 |
| 4,153,988 | 5/1975 | Doo | 361/763 |
| 4,322,778 | 3/1982 | Barbour et al. | 361/414 |
| 4,420,790 | 12/1983 | Golke et al. | 361/283 |
| 4,505,029 | 3/1985 | Owyang et al. | 29/589 |
| 4,598,307 | 7/1986 | Wakabayashi et al. | 357/75 |
| 4,617,586 | 10/1986 | Cuvilliers et al. | 357/80 |
| 4,670,770 | 6/1987 | Tai | 257/665 |
| 4,714,952 | 12/1987 | Takekawa | 361/421 |
| 4,744,008 | 5/1988 | Black et al. | 361/386 |
| 4,945,399 | 7/1990 | Brown et al. | 357/74 |
| 5,001,545 | 3/1991 | Kalfus | 257/773 |
| 5,016,087 | 5/1991 | Haug et al. | 357/75 |
| 5,049,979 | 9/1991 | Hashemi et al. | 357/75 |
| 5,086,370 | 2/1992 | Yasaitis | 361/313 |
| 5,095,402 | 3/1992 | Hernandez et al. | 361/306 |
| 5,148,266 | 9/1992 | Khandros | 257/665 |

FOREIGN PATENT DOCUMENTS

| | | | |
|---|---|---|---|
| 52-69589 | 6/1977 | Japan | H01L 27/04 |
| 55-86145(A) | 6/1980 | Japan | H01L 27/04 |
| 59-5654(A) | 1/1984 | Japan | H01L 23/52 |
| 62-210661(A) | 9/1987 | Japan | H01L 27/00 |
| 63-70441(A) | 3/1988 | Japan | H01L 23/08 |
| 63-147355(A) | 6/1988 | Japan | H01L 23/50 |
| 63-164257(A) | 7/1988 | Japan | H01L 25/00 |
| 63-318765(A) | 12/1988 | Japan | H01L 27/04 |
| 1-95602(A) | 4/1989 | Japan | H01L 23/92 |
| 2-52464(A) | 2/1990 | Japan | H01L 27/04 |

OTHER PUBLICATIONS

Dhong, et al., "*Method of Increasing On–Chip VDD Decoupling Capacitiance Using a Shielded Micro–Strip Structure,*" IBM Technical Disclosure Bulletin, vol. 34, No. 8, Jan. 1992, pp. 59–60.

Gruber, et al., "*Direct Capacitor Attachment for Logic Chips,*" IBM Technical Disclosure Bulletin, vol 33, No. 3A, Aug. 1990, pp. 229–231.

Fernandez, et al., "*Leadless Decoupling Capacitor Fabricated on Wafer Backsie,*" IBM Technical Disclosure Bulletin, vol. 32, No. 3A, Aug. 1989, pp. 403–404.

Davis, et al., "*Corrugated Capacitor Structure and Process,*" IBM Technical Disclosure Bulletin, vol. 30, No. 3, Aug. 1987, pp. 1304–1305.

Gerstenberg, "Thin Film Capacitors," *Handbook of Thin Film Technology,* 1970, pp. 19–17–19–23.

*Primary Examiner*—Teresa J. Walberg
*Assistant Examiner*—Michael D. Switzer
*Attorney, Agent, or Firm*—McCubbrey, Bartels & Ward

[57] ABSTRACT

A bypass capacitor for use with an integrated circuit module, and method of making the same, are shown. The integrated circuit module comprises an integrated circuit "chip" mounted in opposing relationship to a carrier substrate and having a plurality of interconnects, such as solder bumps or wire interconnects, for providing signal lines and supplying power to the chip. Some of the interconnects are, instead, used to form capacitors such that bypass capitance is placed in close proximity to the chip, while not using up valuable real estate on the chip or on the carrier substrate. Various embodiments of such bypass capacitors are shown.

16 Claims, 6 Drawing Sheets

INTERCONNECT CAPACITORS

FIELD OF THE INVENTION

The present invention relates to the field of bypass capacitors and, in particular, means for forming bypass capacitors in close proximity to high speed integrated circuit chips.

BACKGROUND OF THE INVENTION

Bypass capacitors are commonly used with modern integrated circuit ("IC") "chips" to reduce the noise in the power supplied to the chips. Advances in IC technology have dramatically increased the switching speeds employed by the newest generation of IC devices, so that many new chips are capable of operation at microwave frequencies. High switching speeds increase the problem of power supply noise, a component of which is generated as the device is switched on and off. In order for IC chips to function properly, the power supplied must be relatively "clean", i.e., free from noise.

Use of bypass capacitors to alleviate power supply noise problems is well known. It is also well known that it is desirable to position the bypass capacitor as close as possible to the chip for best effect. The leads connecting the capacitor to the chip have an inherent inductance which becomes significant at high speed operation, to the point that if the capacitor is positioned too far from the chip, the lead inductance can cancel the usefulness of the capacitor for eliminating power supply noise. The maximum tolerable distance between the bypass capacitor and the chip is a function of the lead diameter (and, hence, inductance) and the frequency of chip operation. As device geometries shrink so have lead diameters. Thus, at high frequency operation, it has become increasingly important to minimize the lead length by moving the capacitor as close as possible to the chip.

Prior art methods of accomplishing this include mounting a discrete capacitor on or near the IC chip, or forming a capacitor on or as part of the carrier substrate used to hold the chip and to interconnect it to the "outside" world.

Various methods are available for connecting IC chips to other devices. Connections are required not only for power supply, but also for signal lines between chips, other device components and various input/output ("I/O") devices. One class of interconnect methods involve so-called "flip-chip" bonding in which the active surface of the IC chip is mounted in opposing relationship onto a carrier substrate. Flip-chip bonding has the advantage of providing a relatively high density of connections in a small area. For convenience, a chip mounted on a carrier substrate will be referred to as a chip module.

The most common interconnect technology associated with flip-chip bonding involves the use of solder bumps. Typically, arrays of opposing solder bumps are formed on both the active surface of the chip and the carrier substrate. The solder is melted or "reflowed" and the arrays are brought into alignment so that connection is made. As the solder hardens, solder posts are formed between the chip and the substrate. This technique is often referred to in the literature as "C4" (or "C$^4$") technology. Other interconnect techniques used in connection with flip-chip bonding include the use of wire interconnect posts formed on one or the other of the substrates (i.e., either the chip or, more commonly, the carrier) and then joined to connection pads on the other, for example, by soldering.

As IC device densities have increased the number of required interconnections has increased while the space available for the interconnections has decreased. As noted, this has encouraged increased use of flip-chip bonding technologies. The result of these greater device densities is also that the real estate available both on the chip and on (or within) the carrier substrate has become increasingly more valuable. Since signal and power supply routing is frequently accomplished through the carrier substrate, increasing the number of signal lines increases the complexity of the carrier substrate. Carder substrates are typically multilayer structures fabricated using known ceramic or copper/polyimide technologies. While the traditional approach to handling the greater complexity has been to add more layers to the carrier substrate, there are limits to the number of layers that can be used. Adding layers results in reduced product yields, which is undesirable. Likewise, adding fabrication steps results in lower yields.

Accordingly, there is a need for a power supply bypass capacitor which is easy to form and which can be positioned quite close to an IC chip without taking up valuable real estate on the chip or on the carrier substrate.

Therefore, an object of the present invention is to provide a novel bypass capacitor which is positioned in close proximity to an integrated circuit chip.

Another object of the present invention is to provide a bypass capacitor which takes up only minimal real estate on the surface of the chip and on the surface of the chip carrier.

Another object of the present invention is to provide a bypass capacitor that is relatively easy to form, so that yields of chip modules are increased.

SUMMARY OF THE INVENTION

The present invention relates to bypass capacitors used in connection with integrated circuit chips. In the present invention, the bypass capacitor is formed as a part of the interconnection means for bonding the IC chip to a carrier substrate. The interconnection means comprises a plurality of connector elements, at least one of which is used to form part of a bypass capacitor. In one embodiment, the bypass capacitor is formed by disposing a dielectric film between opposing solder bumps. In another embodiment, a dielectric film is disposed between a wire interconnect post and a connecting portion, which may be, for example, a solder bump or a recess in a substrate. In many of the embodiments, solder or other reflowable material used in bonding the IC chip to the carrier substrate is used to form one of the plates of the bypass capacitor.

DETAILED DESCRIPTION

The present invention is concerned with the need to provide a bypass capacitor in very close proximity to a high speed integrated circuit chip so that a clean, i.e., relatively noise free, source of power can be delivered to the chip. While it is known that it is desirable to place a bypass capacitor close to an integrated circuit chip, or other active-circuit device with which it is associated, it has not always been an easy task to do so. Both the chip and the carrier substrate to which it is mounted have a limited amount of surface area or "real estate" available. As device geometries shrink and device complexity increases, the ability to free up enough real estate on either the chip or the carrier for one or more bypass capacitors has become even more difficult. At the same time, the additional trend towards ever higher device speed operation has made it all the more important that the bypass capacitors be close to the chip.

Accordingly, the present invention is directed to the formation of bypass capacitors as a part of the interconnection means used to join a chip to its carrier substrate. A first embodiment of the present invention is shown in FIGS. 1A–1D. (As will be apparent to those skilled in the art, the embodiments shown in the figures hereof are highly schematic and are not drawn to scale.)

Figure 1A:
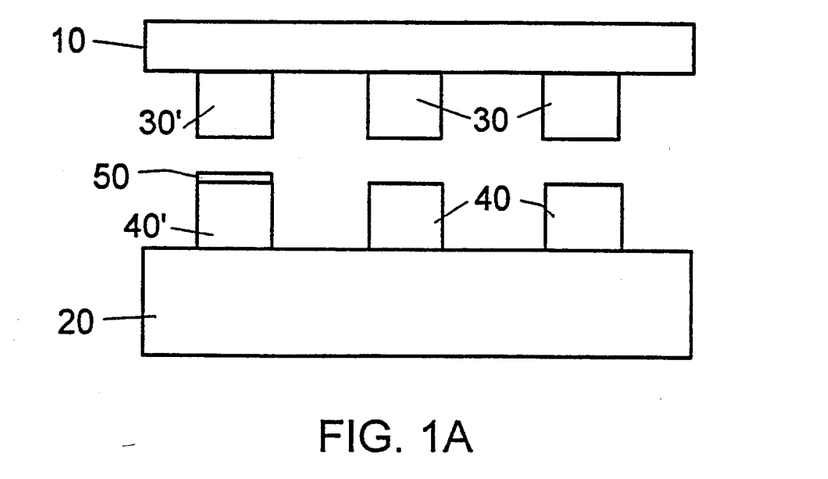
FIGS. 1A–1C are cross-sectional views of a first embodiment of the present invention schematically showing an IC chip and a carrier substrate prior to and after bonding.

FIG. 1A shows an integrated circuit chip 10 in an opposing relationship to a carrier substrate 20 prior to bonding. A plurality of solder bumps 30 are disposed on the surface of chip 10 which faces carrier 20, and a corresponding plurality of solder bumps 40 are disposed on the opposing surface of carrier 20. For simplicity only three solder bumps are shown on each surface, although, in practice, the number of solder bumps will be much larger. In FIG. 1A the IC chip and the substrate are shown in an opposing relationship.

The use of solder bumps to flip-chip bond an IC chip to another surface is a well known technique which need not be described in detail. Likewise, methods of forming solder bumps on both an IC chip and on a carrier substrate are well-known. In a typical solder bump array, there will be bump sites that are not needed for signal or power conduction. These sites are used in the present invention to form capacitors as follows. As shown in FIG. 1A, bump 40' on the carrier substrate is coated with a dielectric layer 50. Dielectric layer 50 can be formed of any of a number of insulating materials commonly used in integrated circuit packaging technology, including, for example, polyimide, plastic or epoxy resins, oxides, etc. Dielectric layers can be deposited by direct means, e.g., they can be "painted" or printed on, as by silk screening or lithographic techniques, or they can be applied indirectly, e.g., using photolithographic techniques standard to the semiconductor fabrication industry.

The dielectric selected in connection with the FIG. 1 embodiment must be pinhole free, conformable, flexible and insoluble in the type of solder used to form the solder bumps. Polyimide is preferred in certain circumstances. Polyimide is easy to cure and has a dielectric constant which can be controlled. In addition, when diluted with n-methyl pyrollidone, it can be made relatively low in viscosity so that it can be easily silk screened to a predetermined desired thickness. Polyimide with a desired flexibility can be obtained by choosing the right polyimide precursor.

Figure 1B:
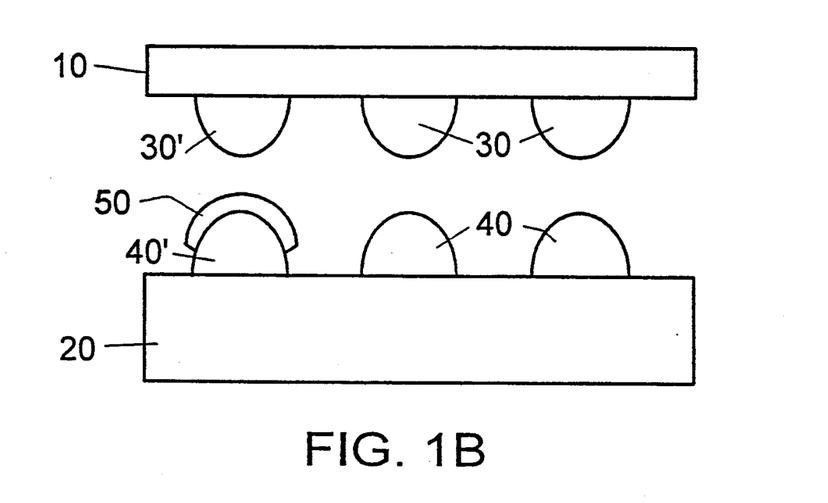

FIG. 1B shows IC chip 10 and carrier substrate 20 in opposing relationship just prior to bonding. In FIG. 1B the solder bumps 30, 40 have been melted and have collapsed to a substantially hemispherical shape. When first formed on the substrates, the solder bumps are typically cylindrical as shown in FIG. 1A. Reflowing the solder prior to bonding the chip to the carrier substrate is a well known technique. Reasons for reflowing the solder prior to bonding are to drive off any volatile organics remaining on the solder bumps after they are formed and/or to make sure that the solder components are homogeneously mixed. This pre-bonding reflow causes the solder bumps to become hemispherical as shown. Also as shown, dielectric layer 50 conforms to the changed shape of solder bump 30'.

Figure 1C:
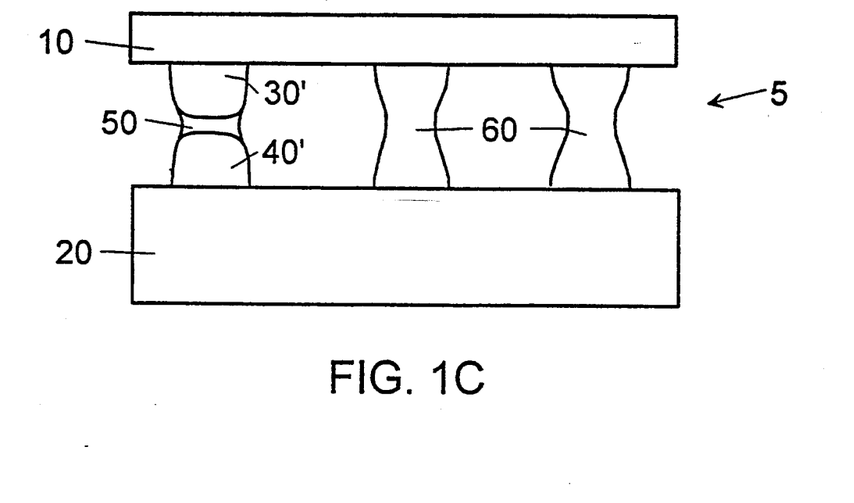

FIG. 1C shows the IC chip and the carrier substrate after they have been joined using standard C4 bonding techniques. The uncoated opposing solder bumps are melted into each other forming interconnect columns 60. As is well known, surface tension causes the bumps to collapse into each other after they connect. However, the dielectric coating 50 on bump 40' prevents bumps 30' and 40' from joining; rather, they are forced into intimate contact by the collapse of the remaining bumps. The upper surfaces of the bumps 30' and 40' are distorted into flat contact with each other with the dielectric coating separating the two surfaces. If one of the bumps is connected to a power line and the other to ground, a bypass capacitor is formed. Those skilled in the art will also appreciate that, in some instances, it may be also desired to connect a signal line and either power or ground to the plates of such a capacitor as part of a microwave supply matching network.

While the embodiment of FIGS. 1A and 1B shows the dielectric coating being deposited first on the solder bump 40' located on the carrier substrate 20, those skilled in the art will appreciate that, alternatively, the dielectric could be first coated on bump 30' on the IC chip. After they are joined, IC chip 10 and carrier substrate 20 form chip module 5, as shown in FIG. 1C. While FIG. 1C shows a single chip mounted on carrier substrate 20, it will be apparent to those skilled in the art that multiple chips can be mounted on a single substrate to form a multichip module.

In practice, the bypass capacitors formed from solder bumps as in FIG. 1C will be relatively small. Thus, in the preferred embodiment multiple bypass capacitors are formed from opposing solder bumps and joined in parallel to raise the overall bypass capacitance.

Figure 1D:
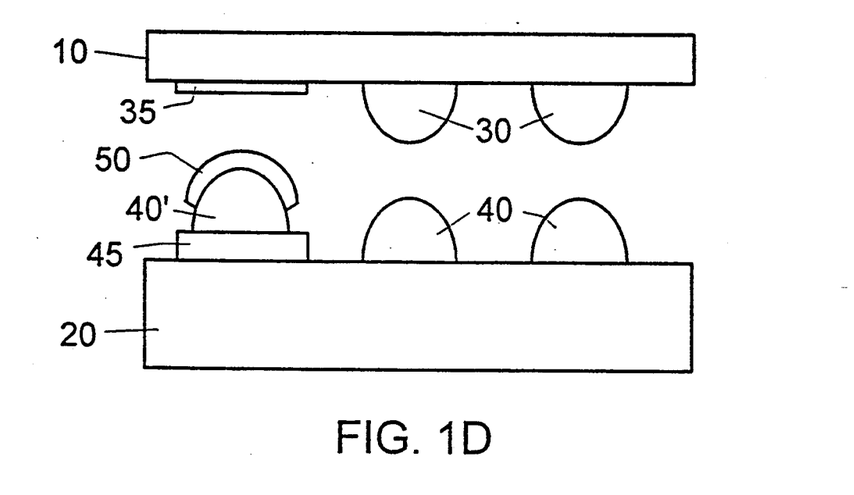
FIG. 1D is a variation of the embodiment of FIGS. 1A–1C shown just prior to bonding.

A variation of the embodiment of FIGS. 1A–1C is shown in FIG. 1D. In this variation, a metallic contact pad 35 is formed on IC chip 10 in lieu of solder bump 30'. Metallic pad 35 is made of a material having a higher melting point than the solder used for bumps 30, 40, and may be formed using a number of different well-known techniques. When the IC chip 10 and carrier substrate 20 are bonded, dielectric layer 50 on solder bump 40' is pressed into intimate contact with metallic pad 35, thereby forming a bypass capacitor. Again, the collapse of the other solder bumps causes bump 40' and dielectric layer 50 to flatten as they are pressed against metallic pad 35. Optionally, solder bump 40' may be deposited on a second metallic pad 45 in order to ensure that intimate contact is made with metallic layer 35. Alternatively, solder bump 40' may be made larger than solder bumps 40, or may be forced to have a narrow diameter base to thereby ensure it has greater height than the other bumps.

Figure 2A:
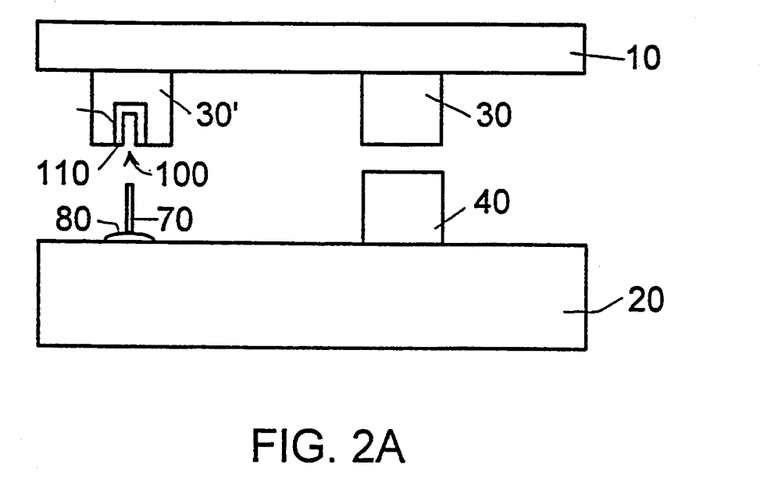
FIG. 2A is a cross-sectional view of a second embodiment of the present invention schematically showing an integrated circuit chip and a carrier substrate just prior to being flip-chip bonded.
Figure 2B:
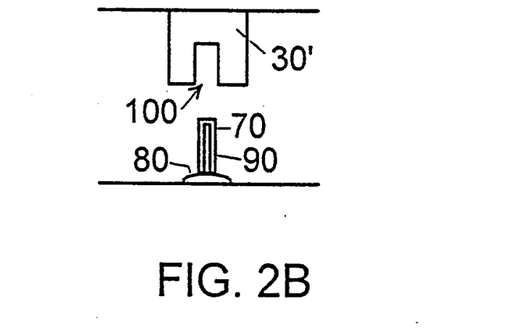
FIG. 2B is a partial cross-sectional view of an alternate embodiment of the design of FIG. 2A.

FIGS. 2A and 2B show a second embodiment of the present invention employing wire interconnect technology in addition to solder bump technology. In wire interconnect technology a plurality of wires or posts, such as wire interconnect 70, are used to connect IC chip 10 to a carrier substrate 20. Methods of fabricating wire interconnects are known. One well known method comprises use of wire bonding apparatus which forms wire interconnects from gold or copper directly on a substrate. Such an apparatus also forms and attaches a "ball" 80 of the same material at the base of the wire when it is mounted. In this manner, wire interconnects 70 of any desired length can be formed.

Another method of forming wire interconnect posts is as follows: applying a polyimide layer onto a substrate (which could either be a surface of the IC chip or of the carrier substrate), depositing a film of aluminum, for example, by sputtering, applying and patterning a photoresist over the aluminum layer, etching the patterned aluminum layer to thereby form a mask layer over the polyimide, etching the polyimide to form holes at the locations where the posts are to be formed, removing the remaining aluminum, filling the holes in the polyimide layer with a metal, such as copper, as by electroless plating, electroplating, or CVD, and, finally, removing the polyimide layer to leave free-standing interconnect posts. As an additional step, a base of material, such as a solder mass, may be first formed on the substrate or may be formed surrounding the posts after they are fabricated.

Interconnects formed by either of these methods have much higher aspect ratios than solder bumps, and are better able to withstand the stresses associated with thermal cycling of the resulting chip module.

Figure 4:
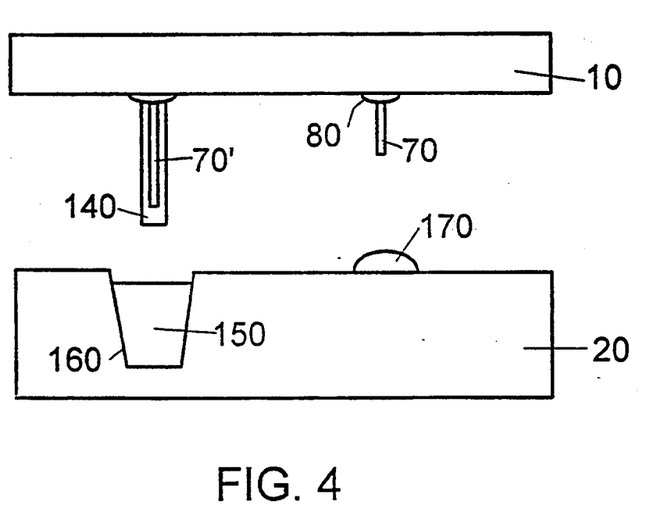
FIG. 4 is a cross-sectional view of a fourth embodiment of the present invention schematically showing an integrated circuit chip and a carrier substrate just prior to being flip-chip bonded.

In the embodiments of FIGS. 2A and 2B, wire interconnects 70 are used for forming one plate of the bypass capacitors, and opposing solder bumps 30 and 40, formed on the IC chip and the carrier substrate, respectively, are used to provide electrical connection between chip 10 and carrier substrate 20 as described above. Thus, the embodiment of FIG. 2 shows a hybrid interconnect means employing two technologies, i.e., solder bumps and wire interconnects. Alternatively, wire interconnect structures may be used in the embodiment of FIG. 2 instead of solder bumps to provide electrical interconnections between carrier substrate 10 and IC chip 20, as is shown in FIG. 4 and described below.

In FIG. 2A, wire interconnect 70 is mounted on carrier substrate 20 and has a metallic mass 80 formed at the bottom periphery thereof. As described above, metallic mass may either be formed of the same material used for wire interconnect 70, or may be a solder mass, depending on the fabrication technique utilized. In opposing relation to wire interconnect 70 is a solder bump 30' having a well 100 for receiving wire interconnect 70. A dielectric coating 110 is deposited within well 100. Well 100 may be formed by standard etching techniques. For example, a photoresist layer may be spun onto the surface of chip 10 having solder bumps. This layer may then be patterned in select areas such that the layer overlying the center portion of preselected solder bumps is removed. Well 100 is then formed by an etching technique which leaves the photoresist layer unaffected. A layer 110 of a conformable dielectric, such as parylene TM (obtainable from Union Carbide), may then be deposited within well 100, for example by chemical vapor deposition. The overall diameter of solder bump 30' may, typically, be 150 $\mu$m, and the diameter of well 100 may be in the range of 15-50 $\mu$m. These well diameters are sufficiently large that formation by photolithographic techniques does not present a problem.

When IC chip 10 is bonded to carrier substrate 20, solder bumps 30 and 40 melt into one another forming column 60 as shown in FIG. 1C. At the same time, wire interconnect 70 is mated with the recess in well 100, thereby forming a bypass capacitor having wire interconnect 70 as one of its plates and the opposing portions of solder bump 30' as the other plate. Again, one of these plates must be electrically connected to ground while the other is connected to the power supply line.

When interconnect 70 is formed by the second method described above, and a solder mass is positioned at the base of the interconnect, as described, the solder mass is melted during the bonding process and surface tension will cause the solder to travel up the surface of wire interconnect 70 filling any gaps between the wire and the surface of dielectric coating 110. On the other hand, by using a solder dam or other similar structure, such upward movement of the solder can be prevented.

A variation of the embodiment of FIG. 2A is shown in FIG. 2B. In the FIG. 2B embodiment, well 100 in solder bump 30' is formed as described above. However, rather than depositing a dielectric coating in well 100, a dielectric coating 90 is formed on the surface of wire interconnect 70. The coated wire interconnect is inserted into the well of solder bump 30' during the reflow/bonding process. Again, known techniques, such as chemical vapor deposition of parylene, may be used to form the dielectric layer on wire interconnect 70. For simplicity, only the capacitor portions of the FIG. 2B variation are shown. The remaining interconnect portions are as described above.

While the embodiment of FIG. 2B shows a well 100 formed in solder bump 30' prior to the bonding of the IC chip to the carrier substrate, such a well need not be formed. Instead, solder bump 30' can be formed in the standard manner without a well and dielectric coated wire interconnect 70 can be inserted into it after bump 30' has been melted. This alternative embodiment reduces fabrication complexity but may result in a smaller opposing surface area between the capacitor plates.

In the FIG. 2 embodiments, care must be taken to assure that the wire, well and bump dimensions are such that metal mass 80 does not contact solder bump 30' and short the plates of the capacitor. This potential problem can also be avoided if the dielectric coating is extended further than is shown. Thus, in the FIG. 2A variation, dielectric coating 110 can be extended to cover the front surface of solder bump 30', and in the FIG. 2B variation dielectric coating 90 can be extended to also cover mass 80.

While the embodiments of FIGS. 2A and 2B show wire interconnects 70 as being formed on carrier 20 and the mating structure as being formed on chip 10, it will be apparent to those skilled in the art that the opposite arrangement is both feasible and equivalent. Likewise, while the embodiment of FIG. 2A is shown with only one opposing pair of solder bumps (30, 40) and one wire interconnect 70, in actual practice a large number of both types of structures are used.

Figure 3A:
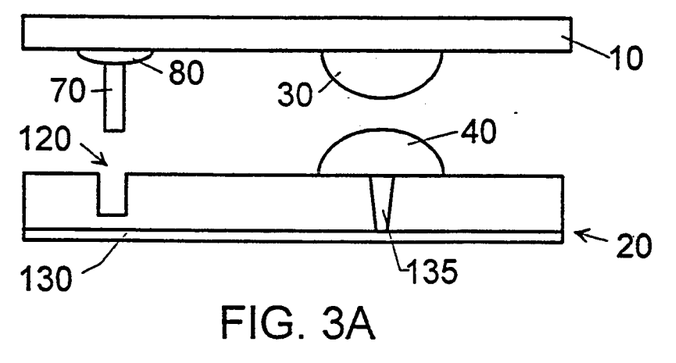
FIG. 3A is a cross-sectional view of a third embodiment of the present invention schematically showing an integrated circuit chip and a carrier substrate just prior to being flip-chip bonded.
Figure 3B:
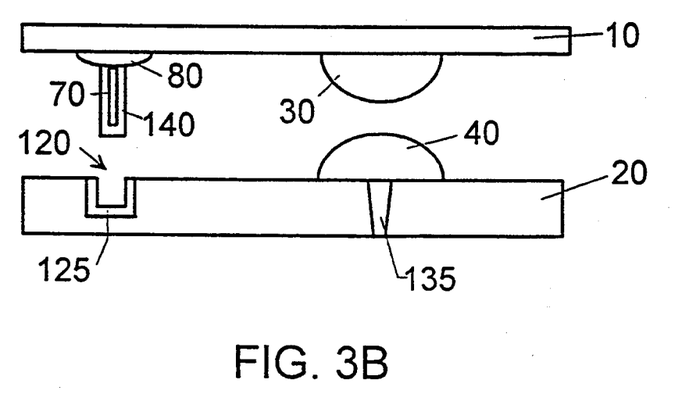
FIG. 3B is a cross-sectional view of an alternate embodiment of the design of FIG. 3A.

FIGS. 3A and 3B show two variations of another embodiment of the present invention which, again, employ a hybrid interconnect structure including both solder bumps (30, 40) and wire interconnects 70. Although it is similar to the embodiments of FIGS. 2A and 2B, the embodiment of FIG. 3 does not have solder bumps 30' mounted on the surface of the chip 10 in opposing relationship to the wire interconnects 70. Instead, recesses 120 (for simplicity only one such recess is shown) are formed in the carrier substrate 20 in aligned mating relationship to wire interconnects 70 which are mounted on chip 10.

In the embodiment of FIG. 3A the surface layer of carrier substrate 20 is formed from a dielectric material such as polyimide. Recess 120 is formed in this dielectric layer. Beneath the dielectric surface layer is a conductive metal layer 130, for example formed of copper. As shown, a metal filled via 135 connects solder bump 40 with metal layer 130. A bypass capacitor is formed when chip 10 is connected to carrier substrate 20. During the bonding process, wire interconnect 70 is inserted into recess 120. One plate of the capacitor is wire interconnect 70, and the other plate is metal layer 130. The surface layer of carrier 20, wherein recess 120 is formed, acts as the dielectric between the two plates of the resultant capacitor.

Wire interconnect 70 may not fit snugly within recess 120 and, thus, there will be a space or gaps between the wall of the recess and the wire interconnect. This gap is filled with air or other dielectric fluid, depending on the operating environment of the chip. The bypass capacitor formed in this matter is electrically connected to bump 40 by metal layer 130.

In the embodiment of FIG. 3B, a metallic layer 125 is formed in recess 120 to serve as one plate of the bypass capacitor of the present invention. Conveniently, layer 125 may be formed of solder so that it reflows into a shape that conforms to the inserted wire interconnect 70 when chip 10 and carrier 20 are bonded. Alternately, metallic layer 130 may be formed by a conventional process for depositing metal onto semiconductor chips, such as sputtering or chemical vapor deposition. A dielectric coating 140 is formed on wire interconnect 70 and serves as the dielectric material for the capacitor. This embodiment increases the opposing surface area of the capacitor plates over the FIG. 3A embodiment, although it is more difficult to fabricate.

FIG. 4 shows yet another embodiment of the present invention similar to the embodiment of FIG. 3. However, the FIG. 4 embodiment does not employ a hybrid of interconnect technologies, but rather uses wire interconnects throughout for both electrical connection and for forming bypass capacitors. In addition, the wire interconnects 70 of FIG. 4 are mounted on chip 10 rather than on carrier substrate 20. As shown some of the wire interconnects 70' (only one is shown in FIG. 4) are longer than the others. Using the wire bonding technique described above, it is a relatively straightforward matter to obtain wires of differing lengths as used in this embodiment. Wire interconnects 70' have a dielectric coating 140 coveting their outer surface; e.g., parylene. When chip 10 is bonded to carrier substrate 20, wire interconnect 70' is inserted into molten solder plug 150 in a via 160 which has been formed by conventional means, such as etching, in the carrier substrate. Thus, a bypass capacitor is formed having solder plug 150 as one of its plates, wire interconnect 70' as the other plate and dielectric coating 140 therebetween. At the same time, electrical connection is made by joining wire interconnect 70 to solder mass 170 on the surface of carrier 20.

Figure 5:
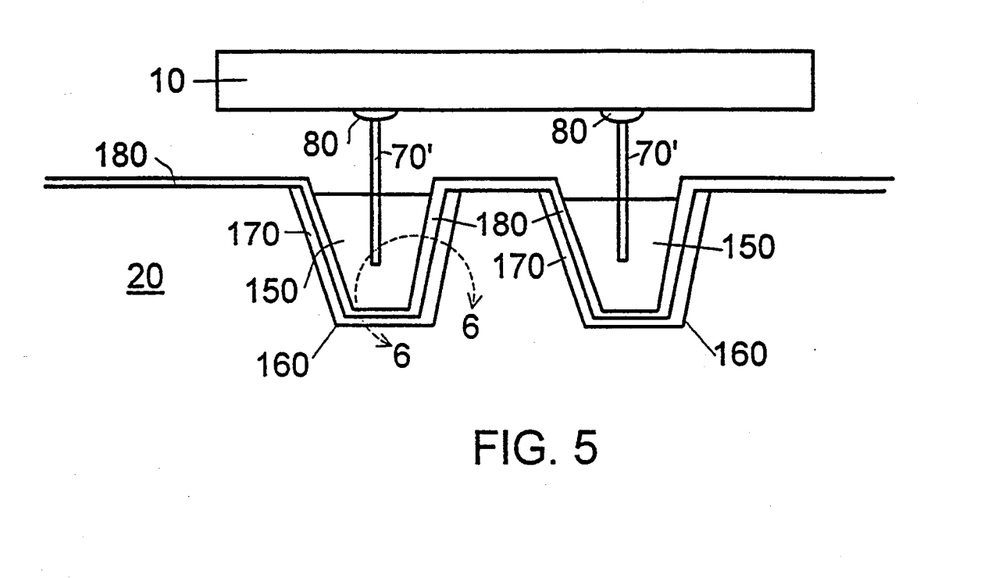
FIG. 5 is a cross-sectional view of a fifth embodiment of the present invention schematically showing an integrated circuit chip bonded to a carrier substrate.
Figure 6:
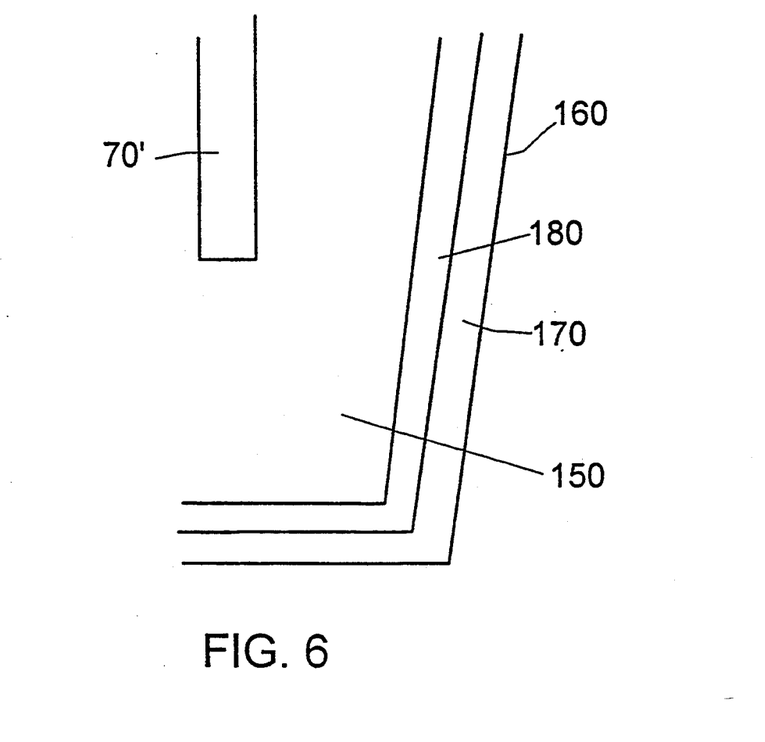
FIG. 6 is a detailed partial cross section of the embodiment of FIG. 5.

Yet, another embodiment of the present invention is shown in FIGS. 5 and 6, which is similar in some respects to the embodiment of FIG. 4. In FIG. 5, two bypass capacitors are shown, again using wire interconnect technology. The other interconnections between chip 10 and carrier substrate 20 may be made using any conventional technology, for example, solder bumps or wire interconnects, as described above.

Wire interconnects 70' are inserted into solder plugs 150 formed in vias 160 in the carrier substrate. Metal layer 170 and dielectric layer 180 are first deposited on the walls of the vias using any of a number of known technologies, as described below. In the embodiment of FIGS. 5 and 6 bypass capacitors are formed having metallic layer 170 as a first plate, the opposing surfaces of solder plug 150 as the second plate, and the dielectric layer 180 therebetween. It is noted that, for a given size via and a given type and thickness of dielectric material, the structure of FIGS. 5 and 6 will have greater capacitance than the structure of FIG. 4 due to the larger opposing plate surface area. In addition, the capacitance of the embodiment of FIG. 5 will depend on the thickness of the dielectric layer 180. Again, in the preferred embodiment, bypass capacitance is provided by connecting a plurality of individual bypass capacitors as described herein in parallel. The overall bypass capacitance can be adjusted by varying the number of interconnects used for bypass capacitors, by varying the thickness of the dielectric, and/or by varying the depth of the vias.

As shown, wire interconnects 70' are relatively narrower than the vias into which they are inserted, and are inserted a distance into solder plug 150. This configuration is particularly advantageous as it allows for alignment errors and for warpage (non-planarity) of the carrier substrate and/or the chip.

A variety of processes can be used for fabricating the bypass capacitors of FIG. 5, for example, one such procedure is as follows. Wire interconnects 70' are formed on IC chip 10 as described above, and vias 160 are formed in carrier substrate 20 using standard etching techniques. The size and depth of the vias used in present invention are well with the capabilities of standard etch technology. For example, in one embodiment, the via openings are 50 microns in diameter and the via aspect ratio is approximately two-to-one. Metal layer 170 is deposited in via 160 by a physical deposition process, such as sputtering, or by chemical vapor deposition ("CVD"). Sputtered aluminum may conveniently be used for forming these layers. The aluminum layer may then be patterned as required to provide lead lines for electrically connecting layer 170.

Dielectric layer 180 can be formed from a variety of materials using a variety of known processes. An anodization process is particularly convenient when sputtered aluminum has been used for metal layer 170, whereby, for example, an aluminum oxide film is formed on the surface of the aluminum layer by applying a positive potential to the layer in an anodizing solution. Alternatively, an oxide film, such as tantalum pentoxide ($Ta_2O_5$), can be deposited by CVD, or a silicon dioxide film can be deposited by reactive sputtering of silicon in an oxygen rich atmosphere. Finally, a self-hardening, low-viscosity, conformable dielectric liquid, such as Sol-Gel, may be spun onto the substrate after the metal layer has been formed. In whatever manner the dielectric layer is formed, it is next patterned using known techniques.

After the metal and dielectric layers are formed and patterned, solder is placed in the vias using standard mask evaporation or screen printing methods. As is known, when using screen printing, it is difficult to apply solder fully into the bottom of the vias. However, this will be remedied when the solder is reflowed in connection with the process for joining the IC chip with the substrate.

Finally, one plate of the resulting bypass capacitor is connected to the power line and the other plate is connected to ground.

While the present invention has been described in connection with several preferred embodiments thereof, those skilled in the art will recognize that other changes and embodiments may be made without departing from the spirit thereof. Accordingly, the scope of the present invention should be construed only with reference to following claims.

What is claimed is:

1. An integrated circuit module, comprising:
   an integrated circuit chip,
   a carrier substrate for supporting said integrated circuit chip in flip-chip relationship to said carrier substrate, said integrated circuit chip being mounted directly on said carrier substrate,
   interconnection means comprising a plurality of discrete connector elements disposed between said integrated circuit chip and said carrier substrate,
   a capacitor on or between said integrated circuit chip and said carrier substrate, at least one plate of said capacitor being formed from one of said discrete connector elements.

2. The module of claim 1 wherein said discrete connector elements comprise solder bumps.

3. The module of claim 1 wherein said discrete connector elements comprise wire interconnects.

4. The module of claim 3 wherein one of said wire interconnects is disposed in a solder filled recess in said carrier substrate.

5. An integrated circuit module, comprising:
   an integrated circuit chip,
   a carrier substrate for said integrated circuit chip,
   interconnection means comprising a plurality of solder bumps disposed between said integrated circuit chip and said carrier substrate,
   wherein a dielectric material is disposed between opposing solder bumps mounted on said carrier substrate and on said integrated circuit chip thereby forming a capacitor.

6. A capacitor formed between two opposing substrates, comprising:
   a first solder bump mounted on a first substrate,
   a second solder bump mounted on a second substrate in opposition to said first solder bump,
   a dielectric material disposed between said first and second solder bumps.

7. A capacitor formed between two opposing substrates, comprising:
   a wire interconnect mounted on a first substrate,
   an opposing solder bump mounted on a second substrate, said wire interconnect being inserted into said solder bump when said solder bump is reflowed, and
   a dielectric layer between said solder bump and said wire interconnect.

8. The capacitor of claim 7 wherein said solder bump has a well for receiving said wire interconnect.

9. The capacitor of claim 8 wherein said well in said solder bump is lined with a dielectric material.

10. The capacitor of claim 7 wherein said wire interconnect is coated with a dielectric material.

11. A capacitor formed between two opposing substrates, comprising:
    a wire interconnect mounted on a surface of a first substrate,
    a mating recess formed in a dielectric upper layer of a second substrate, said second substrate having a metal layer beneath said recess in said upper dielectric layer,
    such that a capacitor is formed when said first and second substrates are mounted in an opposing relationship and said wire interconnect is inserted into said recess.

12. A capacitor formed between two opposing substrates, comprising:
    a wire interconnect mounted on a first substrate, said wire interconnect comprising a dielectric coating,
    a solder-filled recess formed in a dielectric upper layer of a second substrate,
    such that a capacitor is formed when said first and second substrates are mounted in an opposing relationship and said wire interconnect is inserted into said solder-filled recess.

13. A capacitor formed between two opposing substrates, comprising:
    a via formed in a first substrate,
    a first metal layer formed in said via and conforming to the shape thereof,
    means for making electrical contact with said first metal layer,
    a dielectric layer formed over said first metal layer,
    a solder plug filling the via over said dielectric layer, and an interconnect positioned within and extending above said solder plug.

14. A capacitor formed between two opposing substrates, comprising:
    a first active circuit substrate,
    a second carrier substrate in opposing relation to said first substrate, said first active circuit substrate being mounted directly on said second carrier substrate,
    a capacitor intermediate said first and second substrates, wherein at least one of said capacitor plates is made of solder which is reflowed when said first and second substrates are mounted in said opposing relationship.

15. A method of making a capacitor between two interconnected substrates, comprising the steps of:
    forming an array of interconnects on one of said substrates, and
    coating some of the interconnects within said array with a dielectric material, such that capacitors are formed when said substrates are mounted in an opposing relationship.

16. The method of claim 15 further comprising the step of forming a second array of interconnects on said other substrate.

* * * * *

UNITED STATES PATENT AND TRADEMARK OFFICE
CERTIFICATE OF CORRECTION

PATENT NO. : 5,404,265
DATED : April 4, 1995
INVENTOR(S) : Larry L. Moresco, *et al.*

It is certified that error appears in the above-indentified patent and that said Letters Patent is hereby corrected as shown below:

Item [57], line 9,
In the Abstract, "capitance" should read --capacitance--.

Column 2, line 14, "Carder" should read --Carrier--.

Column 8, line 56, "in present" should read --in the present--.

Column 9, line 31, "to following" should read --to the following--.

Signed and Sealed this

Twenty-third Day of July, 1996

Attest:

BRUCE LEHMAN

*Attesting Officer*         *Commissioner of Patents and Trademarks*